United States Patent [19]

Hirano

[11] Patent Number: 4,737,784
[45] Date of Patent: Apr. 12, 1988

[54] KEYLESS ENTRY SYSTEM FOR AUTOMOTIVE VEHICLE DEVICES WITH WEAK-BATTERY ALARM

[75] Inventor: Motoki Hirano, Yokohama, Japan

[73] Assignee: Nissan Motor Company, Limited, Yokohama, Japan

[21] Appl. No.: 651,783

[22] Filed: Sep. 18, 1984

[30] Foreign Application Priority Data

Sep. 19, 1983 [JP] Japan .................. 58-172680

[51] Int. Cl.[4] .............................. H04Q 1/00
[52] U.S. Cl. .................. 340/825.31; 340/825.34; 340/825.69; 340/825.72; 307/10 AT; 361/172
[58] Field of Search ............. 340/825.69, 825.72, 340/825.31, 825.34, 825.54, 572; 343/6.5 R, 6.8 R, 6.8 LC; 307/9, 10 R, 10 AT; 361/171, 172; 375/5

[56] References Cited

U.S. PATENT DOCUMENTS

| 3,196,440 | 7/1965 | Weinstein | 340/825.72 X |
| 3,440,633 | 4/1969 | Vinding | 340/572 X |
| 3,657,720 | 4/1972 | Avdenko et al. | 340/825.69 X |
| 3,859,624 | 1/1975 | Kriofsky et al. | 343/6.5 R X |
| 3,891,980 | 6/1975 | Lewis et al. | 340/825.31 X |
| 4,160,240 | 7/1979 | Partipilo | 340/311.1 |
| 4,205,325 | 5/1980 | Hapgood et al. | |
| 4,388,524 | 6/1983 | Walton | 343/6.5 R X |
| 4,418,416 | 11/1983 | Lese et al. | 375/5 |
| 4,450,431 | 5/1984 | Hochstein | 343/6.5 R X |
| 4,473,825 | 9/1984 | Walton | 340/825.54 |
| 4,509,093 | 4/1985 | Stellberger | 340/825.31 X |
| 4,511,946 | 4/1985 | McGahan | 361/172 |
| 4,670,746 | 6/1987 | Taniguchi et al. | |
| 4,672,375 | 6/1987 | Mochida et al. | |
| 4,688,036 | 8/1987 | Hirano et al. | |

Primary Examiner—Ulysses Weldon
Attorney, Agent, or Firm—Schwartz, Jeffery, Schwaab, Mack, Blumenthal & Evans

[57] ABSTRACT

A keyless entry system can lock and unlock an automotive vehicle door, a trunk lid, a glove box and/or a steering column without an ignition key. The system comprises a transmitter producing a radio signal indicative of a preset unique code, and a controller receiving the radio signal and performing desired locking or unlocking operation when the code from the transmitter matches a preset code. A manual switch is provided to order the transmitter to transmit the code-indicative radio signal to the controller. The transmitter encloses a battery acting as a power source. A battery checker is provided to produce an alarm when the battery voltage becomes lower than a predetermined voltage.

18 Claims, 4 Drawing Sheets

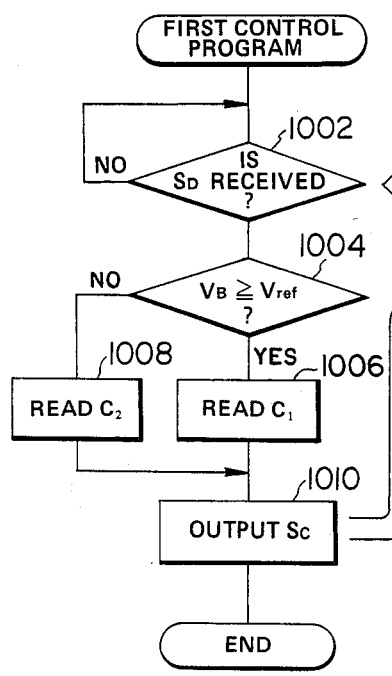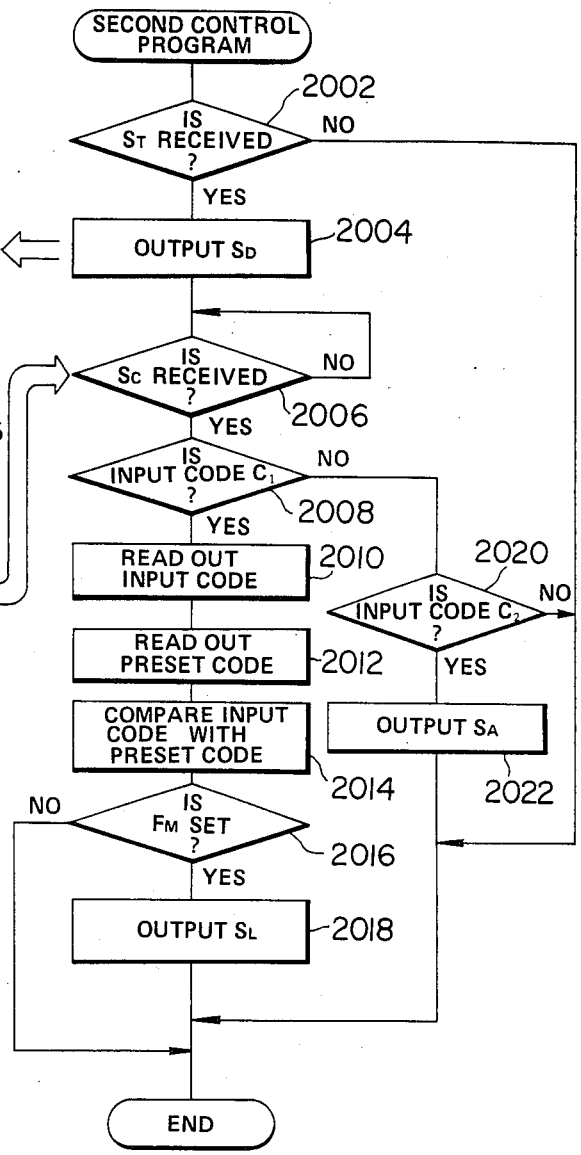

KEYLESS ENTRY SYSTEM FOR AUTOMOTIVE VEHICLE DEVICES WITH WEAK-BATTERY ALARM

BACKGROUND OF THE INVENTION

The present invention relates generally to a unique and novel keyless entry system for operating automotive devices, such as door locks, a trunk lid lock, a glove box lid lock, steering lock devices and/or a starter motor without mechanical keys. In particular, the invention relates to a keyless entry system which is operated by means of a battery and active when a weak battery is detected to produce an alarm.

U.S. Pat. No. 4,205,325, to Haygood et al, discloses a keyless entry system for an automotive vehicle permitting a plurality of operations to be achieved from outside the vehicle by one who is knowledgeable of predetermined digital codes. Functions such as unlocking the doors of the vehicle, opening the rear trunk lid, opening a roof window, lowering the windows or programming the system with a user-preferred digital access code can all be performed by proper sequential operation of a digital keyboard mounted on the outside of the vehicle.

This and other conventional keyless entry systems require the user to accurately input the predetermined code through the keyboard. Although such keyless entry systems have been well developed and considered useful for eliminating the need for mechanical keys, a serious problem may occur when the user of the vehicle forgets the predetermined code. If the user is outside of the vehicle and the vehicle door lock device is holding the doors locked, the user cannot unlock the door locks until he remembers the predetermined code.

The present invention provides a novel and more useful system for operating the vehicle devices without an ignition key and without requiring manual entry of a predetermined code.

SUMMARY OF THE INVENTION

It is an object of the present invention to provide a keyless entry system for automotive vehicle devices, which allows one-touch operation of desired vehicle devices without manually entering a code.

Another object of the present invention is to provide a keyless entry system with weak-battery alarm which produces an alarm when the voltage of a battery, acting as a power source for the system, drops below a predetermined threshold.

In order to accomplish the above-mentioned and other objects, a keyless entry system for automotive vehicle devices according to the present invention comprises a wireless code transmitter which is portable by hand or in pockets and has an enclosed battery acting devices to electrically operate the latter in response to a preset code transmitted from the transmitter. The transmitter transmits a code signal to the controller when one of the vehicle devices is to be operated. The controller is responsive to the code signal when the transmitted code matches a preset code to produce a driver signal which actuates the designated vehicle device.

In the preferred structure, a switch which activates the transmitter is provided on the external surface of the vehicle body and connected to the controller. When the switch is thrown, the controller transmits a demand signal to the transmitter possessed by the user. The transmitter responds to the demand signal by transmitting the code signal to the controller.

The transmitter is provided with a battery checker, which is a kind of voltmeter, monitoring the battery voltage. The battery checker detects when a weak battery generates a battery voltage lower than a predetermined threshold. In such cases, an alarm is produced to notify the user of the need to replace the battery.

In accordance with one aspect of the invention, a keyless entry system comprises an electrical actuator associated with the lock device and responsive a control signal to reverse the position of the lock device, a manual switch manually operable to activate the actuator, a transmitter responsive to operation of the manual switch to output a radio signal indicative of a unique code which identifies the transmitter, a battery for supplying electric power to the transmitter, a controller for receiving the radio signal from the transmitter, comparing the unique code indicated by the radio signal with a preset code, and producing the control signal when the unique code matches the preset code, and a weak-battery alarm means for detecting when the voltage generated by the battery drops below a given voltage and producing an alarm in such cases.

BRIEF DESCRIPTION OF THE DRAWINGS

The present invention will be understood more fully from the detailed description given herebelow and from the accompanying drawings of the preferred embodiment of the present invention, which, however, should not be assumed to limit the invention to the specific embodiments but are for explanation and understanding only.

In the drawings:

FIGS. 5(A) and 5(B) are flowcharts of the operation of the transmitter and the receiver, respectively.

DESCRIPTION OF THE PREFERRED EMBODIMENT

Figure 1:
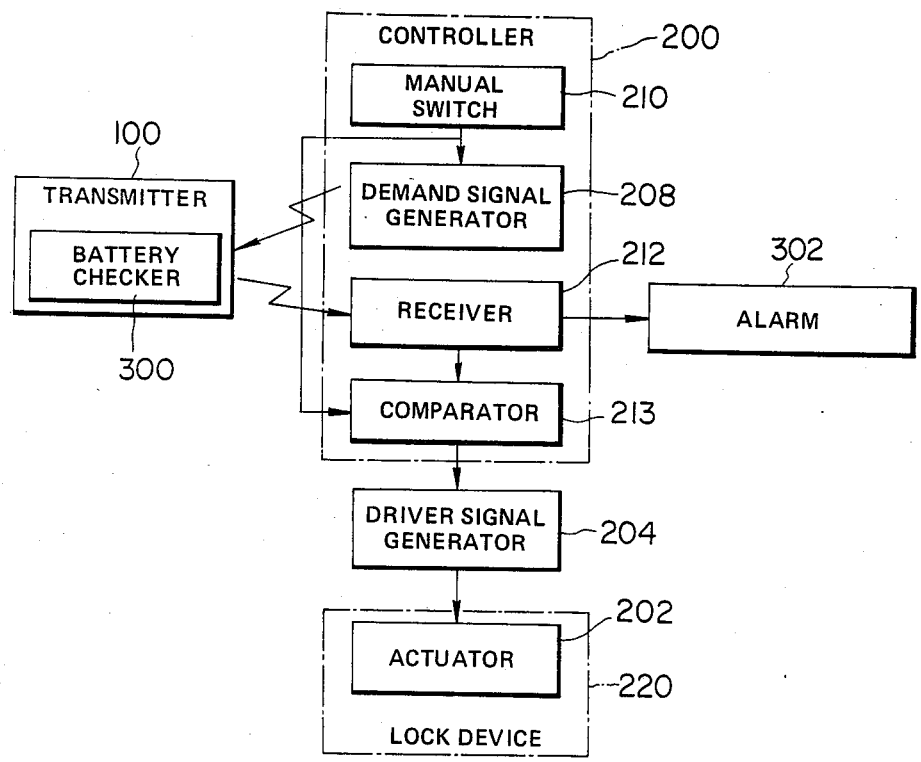
FIG. 1 is a schematic block diagram showing the general concepts of a keyless entry system for an automotive vehicle device according to the present invention.
Figure 2:
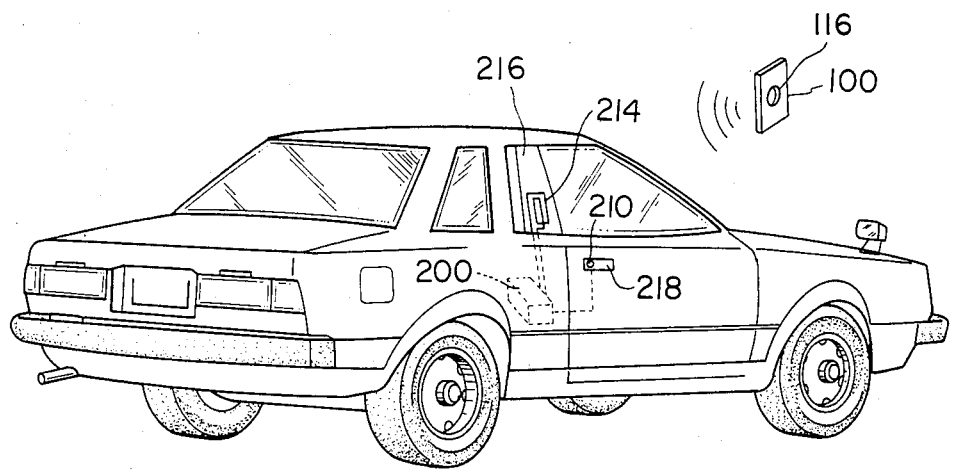
FIG. 2 is a perspective view of an automotive vehicle to which the keyless entry system according to the present invention is applied.

Referring now to the drawings, particularly to FIGS. 1 and 2, the preferred embodiment of a keyless entry system for an automotive vehicle according to the present invention generally comprises a code transmitter 100 and a controller 200. The controller 200 is connected via a driver signal generator 204 to actuators 202 for vehicle devices such as door lock device, a trunk lid lock device, a groove box lid locks and a steering lock device.

The controller 200 includes a demand signal SD generator 208 which sends a demand signal SD to the transmitter 100 to activate the latter. The demand signal SD generator 208 is connected to one or more manual switches 210 which are placed on the external surface of the vehicle so as to be accessible from outside the vehicle. The demand signal SD generator 208 produces a demand signal SD when one of the manual switches 210 is depressed.

Figure 3:
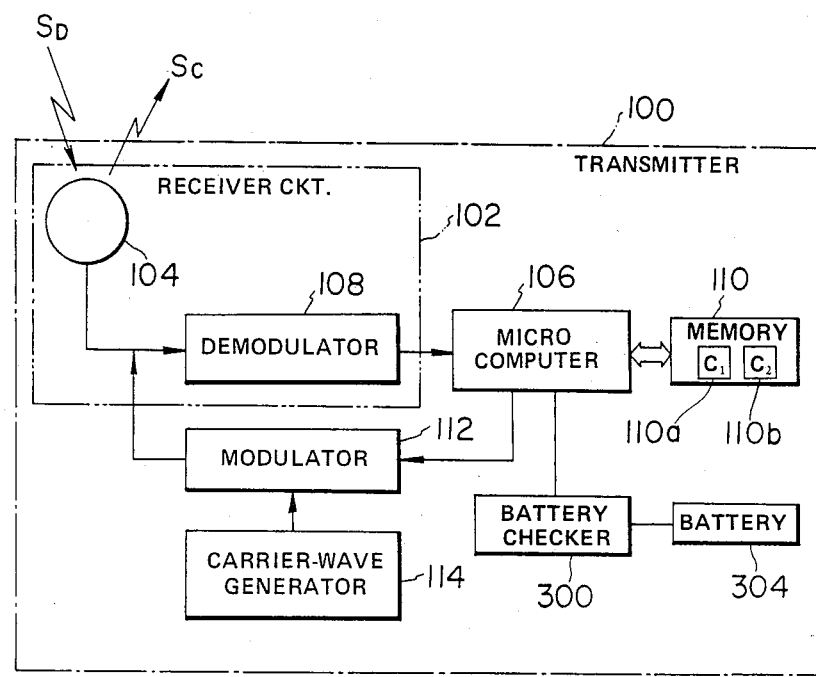
FIG. 3 is a block diagram of a transmitter in the preferred embodiment of a keyless entry system according to the present invention.

As shown in FIG. 3, the transmitter 100 includes a receiver circuit 102 for receiving the demand signal SD from the controller. The transmitter 100 becomes active when the receiving circuit 102 receives the demand signal SD to produce a code signal SC which is indicative of a preset specific code. The preset code of the portable transmitter 100 differs from that of the demand signal SD generator 208 so that the controller 200 can recognize when the transmitter 100 is responding.

As shown in FIG. 3, the transmitter 100 encloses a thin, compact, long-life battery 304, such as a mercury battery, acting as a power source. The battery 304 is connected to a transmitter circuit through a battery checker 300. The battery checker 300 may be a kind of voltmeter monitoring battery voltage. The battery checker 300 compares the battery voltage with a reference voltage which is representative of a predetermined voltage threshold. Preferably, the voltage threshold is set to be slightly higher than the voltage required to operate the transmitter so that the transmitter can be operated at least once after the battery voltage drops below the reference voltage.

The battery checker 300 is adapted to produce an alarm signal when the measured battery voltage is lower than the reference voltage. The transmitter 100 transmits the alarm signal to the controller 200 to activate an alarm device 302 in the controller.

The transmitter 100 continuously transmits the code signal SC to the controller for as long as it remains active. The code signal SC is received by a receiver 212 in the controller 200. The controller 200 has a comparator 213 to compare the received code with a specific preset code. When the received code matches the code preset as compared in the comparator 213, the controller 200 sends a control signal SL to the driver circuit generator 204. The driver signal generator 204 in turn sends a drive signal to one of the actuators 202 corresponding to the manual switch 210 operated. The actuator 202 in activated by the driver signal from the driver signal generator 204 to operate the corresponding vehicle device.

It should be appreciated that, since the vehicle devices to be operated by the first embodiment of the keyless entry system are two-state locking devices for locking and unlocking vehicle doors, the trunk lid, glove box lid, the steering column and so forth, the actuators 202 actuate the vehicle devices from the current position to the opposite position in response to the driver signal. For instance, when the vehicle device is in the locked position, the actuator unlocks the vehicle device in response to the driver signal. On the other hand, when the driver signal is sent to the actuator of a vehicle device which currently unlocked, that vehicle device is then locked.

The transmitter 100 includes a transmitter/receiver antenna 104. In addition, a loop antenna 214 is built into one of the windows 216 of the vehicle. The loop antenna 214 transmits the demand signal SD to and receives the code signal SC from the transmitter 100. As shown in FIG. 2, the manual switches 210 are mounted on an escutcheon 218 of an outside door handle for operation from outside the vehicle.

The transmitter 100 is housed in a case small enough to hand-carry or to pocket.

FIG. 3 shows the circuit structure of the transmitter 100. A microprocessor 106 is connected to the antenna 104 via a demodulator 108 which demodulates the received demand signal SD, and to the battery 304 via the battery checker 300 to receive power therefrom. The microprocessor 106 includes a memory 110 storing the preset code $C_1$ and an alarm $C_2$. In response to the demand signal SD, the microprocessor 106 reads out the preset code $C_1$ to a modulator 112 as long as the battery voltage is higher than a reference voltage. When the battery voltage is lower than the reference voltage, the alarm code $C_2$ is read out from the memory 110 to the modulator 112. The modulator 112 is, in turn, connected to a carrier-wave generator 114 to receive a carrier wave. The modulator 112 modulates the carrier-wave with the code-indicative signal or the alarm-indicative signal from the microprocessor 106 to produce the final code signal SC.

In the preferred embodiment, the antenna 104 of the transmitter 100 is built into the transmitter circuit board or on the surface of the transmitter casing 116 (shown in FIG. 2). The casing 116 is the size of a name card and thin enough to carry in a shirt pocket.

Figure 4:
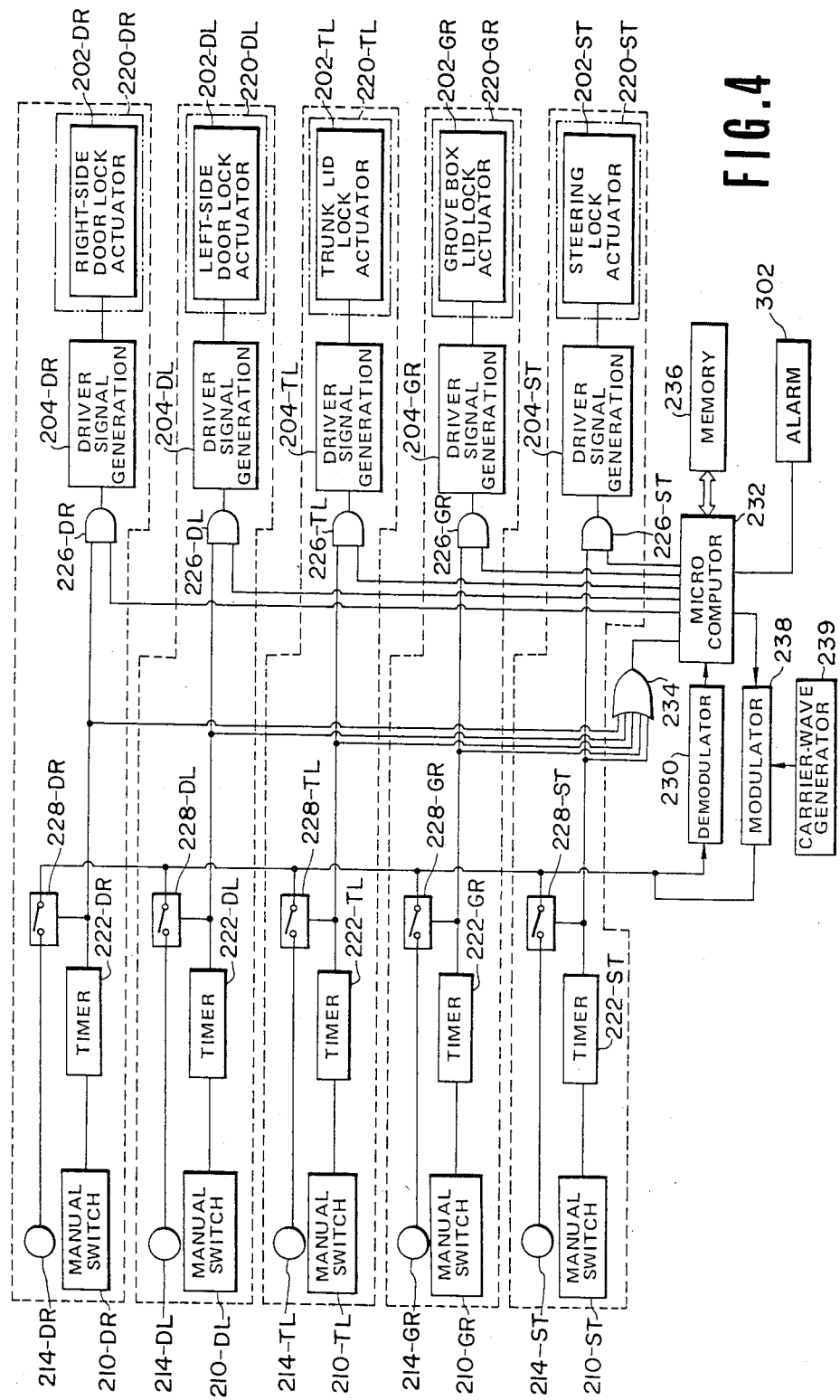
FIG. 4 is a block diagram of a controller in the preferred embodiment of the keyless entry system according to the present invention.

FIG. 4 shows the circuitry of the controller 200. As set forth above, the shown embodiment of the keyless entry system is adapted to operate the door locks, the trunk lid lock, the glove box lock and the steering lock device. In addition, the shown embodiment is adapted to control operation of the locks for the right- and left-side doors independently. In order to allow independent operation of the lock devices, manual switches 210-DR, 210-DL, 210-TL, 210-GL and 210-ST are provided on the vehicle body somewhere nearby the devices to be operated. For example, the manual switches 210-DR and 210-DL are provided adjacent the door handles of respectively corresponding side soors. Similarly, the manual switch 210-TL to operate the trunk lid lock device would be placed adjacent the trunk lid.

Though the specific embodiment has been illustrated to locate respective manual switches adjacent the corresponding vehicle devices to be operated, it would be possible to provide all of manual switched in concentric manner on the outside door handle escutcheon 218, for example.

Each manual switch is operable independently to operate the corresponding lock device. For example, when the manual switch 210-DR is depressed, the right-side door lock 220-DR is actuated to either to the locked or unlocked state.

Each manual switch 210-DR, 210-DL, 210-TL, 210-GL and 210-ST is connected to a timer 222-DR, 222-DL, 222-TL, 222-GL and 222-ST through a normally closed relay 224-DR, 224-DL, 224-TL, 224-GL and 224-ST. The timers, which will be referred to generically with reference numeral "222", are responsive to depression of the corresponding manual switch, which will be referred to generically with reference numeral "210", to produce a HIGH-level timer signal St for a given period of time. This given period of time should be long enough to cover the time required to transmit the demand signal SD from the controller to the transmitter 100 and to receive the code signal SC from the transmitter in return. The timer signal St is fed to a corresponding AND-gate 226-DR, 226-DL, 226-TL, 226-GL and 226-ST, which will be referred to generically with reference numeral "226". At the same time, the timer signal St is fed to a corresponding switching circuit 228-DR, 228-DL, 228-TL, 228-GL and 228-ST, which will be referred to generically with reference numeral "228". The switching circuit 228 closes in response to the timer signal St to connect the corresponding antenna 214-DR, 214-DL, 214-TL, 214-GL or 214-ST, which will be referred to generically with reference numeral "214", to a demodulator 230, whereby the code signal SC received by the corresponding antenna 214 is conducted to the demodulator. The timers 222 are also all connected to a microprocessor 232 via a multi-input OR gate 234. The microprocessor 232 includes a memory 236 which stores the preset code $C_1$ and the alarm code $C_2$ corresponding to those stored in the transmitter 100.

The microprocessor 232 responds to the timer signal St received via the OR gate 234 by outputting the demand signal SD to the transmitter through a modulator 238 and antenna 214. The modulator 238 is connected to the antennae 214 via the switching circuits 228 to transmit the demand signal SD to the transmitter 100. The microprocessor 232 receives the code signal SC via The antenna 214 and the demodulator 230 and compares the received code with the stored code. When the received code matches the stored code, the microprocessor 232 outputs the control signal SL to the other input terminal of the AND gate 226 corresponding to the depressed manual switch. Therefore, at this time, AND gate 226 transmits a HIGH-level signal to the driver signal generator 204-DR, 204-DL, 204-TL, 204-GL or 204-ST, which will be referred to generically with reference numeral "204". The driver signal generator 204 responds to the HIGH-level signal by outputting a driver signal to the corresponding actuator 202-DR, 202-DL, 202-TL, 202-GL or 202-ST of the lock 220-DR, 220-DL, 220-TL, 220-GL or 220-ST.

The microprocessor 232 is also connected to the alarm device 302. The microprocessor 232 sends a drive signal to the alarm device 302 when the input code matches the alarm code $C_2$ in the memory 236. The alarm device 302 is activated by the drive signal from the microprocessor 232 to produce an alarm indicating that the transmitter battery 304 is weak.

The operation of the preferred embodiment of the keyless entry system set forth above will be described in more detail with reference to FIGS. 5(A) and 5(B). The microprocessor 106 of the transmitter 100 repeatedly executes the first control program illustrated in FIG. 5(A). In the first control program, the microprocessor 106 checks for receipt of the demand signal SD from the controller at a step 1002. The step 1002 is repeated until the demand signal SD is received. In other words, the transmitter 100 normally remains in a stand-by state, waiting to produce the code signal SC in response to the demand signal SD.

When the demand signal SD is detected at the step 1002, the output of the battery checker 300 is checked to see if the battery voltage $V_B$ is equal to or higher than the reference voltage $V_{ref}$ at a step 1004. If the battery voltage $V_B$ is higher than the reference voltage $V_{ref}$, the preset code $C_1$ is read from the memory 110 at a step 1006. The microprocessor 106 then outputs the code-indicative signal to the modulator 112 which in turn outputs the code signal SC in step 1010. Control then returns to the stand-by step 1002.

It should be noted that the code signal SC is transmitted from the modulator to the controller for a given period of time and terminates when the given period of time expires. The given period of time during which the code signal SC is transmitted is so chosen that the controller 200 can activate the actuator 202 designated by the operated manual switch before expiration of that period. In addition, the code stored in the memory 110 is preferably a binary code, such as an 8-bit serial datum. This binary code rides on the carrier wave as modulated by the modulator to form the code signal SC.

When the battery voltage is lower than the reference voltage $V_{ref}$ and, thus, the alarm signal from the battery checker 300 is detected when checked at the step 1004, control passes to a step 1008 in which the alarm code $C_2$ is read out. The alarm code $C_2$ read out by the microprocessor 106 is fed to the modulator 112 to be modulated with the carrier-wave from the carrier-wave generator 114. Thus, at the step 1010, an alarm-code-indicative signal is transmitted to the controller.

FIG. 5(B) is a flowchart for the controller. At the initial stage of the second control program of FIG. 5(B), the microprocessor 232 checks for receipt of the timer signal St at a step 2002. If the timer signal St is not detected when checked at the step 2002, the second program ends. This is substantially the same as the loop at the step 1002 in FIG. 5(A) and holds the controller in stand-by until depression of a manual switch. When one of the manual switches 210 is depressed and therefore a timer signal St is sent to the microprocessor 232, control passes to a step 2004, in which the modulator 238 is activated to send a demand signal SD to the transmitter 100 to activate the latter. Thereafter, the controller 200 enters a second stand-by state, waiting for the code signal SC. Specifically, a step 2006 is repeated as a loop until the code signal SC is received. After the code signal SC is input via the antenna 214 and the demodulator 230, the received code is checked to see if it is the preset code $C_1$ of the transmitter 100 at a step 2008. If the input code is the preset code $C_1$ when checked at the step 2008, the received code in the code signal SC is read out at a step 2010. The preset code of the controller 200 is then read out from the memory 236, at a step 2012. The input code and the preset code read out in steps 2010 and 2012 are compared at a step 2014. If the codes match, a matching flag FM is set at the step 2014. The matching flag FM is checked at a step 2016. If the matching flag FM is not set, the program ends. On the other hand, if the matching flag FM is set when checked at the step 2016, then the control signal SL is sent to the driver signal generator at a step 2018.

If the received code is not the preset code $C_1$ when checked at the step 2008, then the received code is again checked to see if it is the alarm code of the transmitter 100, at a step 2020. If so, the microprocessor 232 send the drive signal $S_A$ to the alarm device 302 to activate the latter, at a step 2022. On the other hand, if the received code is not the alarm code when checked at the step 2020, then the program ends.

In the first embodiment as set forth above, since the code signal SC is output only when the demand signal SD is input from the controller, consumption of electric power of the battery in the transmitter is significantly reduced in comparison with system which might employ constant transmission of the code signal SC. Thus, the life-time of the battery of the transmitter is prolonged even though electric power is constantly supplied to the microprocessor to hold same in stand-by. It should be appreciated that the electric power needed to power the microprocessor is substantially smaller than that consumed in transmitting the code signal SC. Therefore, constant power supply to the microprocessor will not significantly affect the life-time of the battery.

Similarly, since the demand signal SD is produced only when at least one of the manual switches is depressed, consumption of the electric power by the controller is significantly limitted.

It is also to be noted that transmission of the demand signal SD and the code signal SC is performed by electromagnetic induction. Since locking and unlocking operations of the lock devices will generally be performed only when the transmitter is near the controller, good communication between the transmitter and the controller can be obtained by electromagnetic induction without significant power consumption.

In order to unlock the right-side door lock device 220-DR, the manual switch 210-DR is depressed. When the ignition switch 302 is in the OFF position, the timer 222-DR becomes active to output the timer signal St. The timer signal St is applied to the AND gate 226DR and to the switching circuit 228-DR, the latter of which then closes to connect the antenna 214-DR to the microprocessor 232.

The timer signal St from the timer 222-DR is also input to the microprocessor 232 via the OR gate 234. The microprocessor 232 responds inputs from the OR gate 234 by activating the modulator 238 to transmit the demand signal SD via the antenna 214-DR.

The demand signal SD transmitted via the antenna 214-DR is received by the antenna 104 of the transmitter 100. Then, the demand signal SD is demodulated by the demodulator 108 to remove the carrier-wave components. The microprocessor 106 of the transmitter 100 then executes the steps 1004 and 1006 of the first control program of FIG. 5(A) and outputs the code-indicative signal to the modulator 112. The modulator 112 thus transmits the code signal SC to the controller 200 via the antenna 104.

The code signal SC is received by the antenna 214-DR and fed to the demodulator 230. The demodulator 230 demodulates the code signal SC to remove the carrier-wave components. The microprocessor 232 receives the demodulated code signal SC and executes the steps 2008 to 2016 of the second control program. When the input code matches the preset code in the memory 236, the microprocessor 232 feeds the control signal SL to the AND gate 226-DR. At this time, since the timer signal St is still being applied to one of the input terminals of the AND gate, the AND condition of the timer signal St and the control signal SL is established and as a result, the AND gate passes a HIGH-level signal to the driver signal generator 204-DR which produces the driver signal. The driver signal is applied to the actuator 202-DR of the right-side door lock device 220-DR to reverse the lock position. Since the right-side door lock device 220-DR was originally locked, it becomes unlocked upon activation of the actuator 202-DR.

Similarly, when the manual switch 210-DL is closed to operate the left-side door lock device, the antenna 214-DL sends the code signal SC to the microprocessor. If the input code matches the preset code, the AND gate 226-DL opens to activate the driver signal generator 204-DL. Thus, if the left-side door lock device is originally unlocked, it becomes locked.

When the manual switch 210-TL is operated, the timer 222-TL become active to send a timer signal St to the AND gate 226-TL and the switching circuit 228-TL. The switching circuit 228-TL then closes to establish electrical communication between the antenna 214-TL and the demodulator 230 and the modulator 238.

The code signal SC is transmitted from the transmitter 100 to the antenna 214-TL in response to the demand signal SD. If the input code is the same as the preset code, then the AND gate 226-TL opens to activate the driver signal generator 204-TL. Therefore, the trunk lid lock device 220-TL switches from its current position to the other position.

When the manual switch 210-GL is operated to open the glove box lid, the timer 222-GL is activated to output the timer signal St. In response to the timer signal St, the switching circuit 228-GL establishes electrical communication between the antenna 214-GL and the demodulator 230. The code signal SC transmitted from the transmitter 100 is thus demodulated by the demodulator and input to the microprocessor 232. The AND gate 226-GL opens in response to the control signal SL from the microprocessor 232 to activate the driver signal generator 204-GL by the gate signal thereof. In response to the driver signal from the driver signal generator 204-GL, the actuator 202-GL become active to reverse the position of the glove box lid lock from locked state to the unlocked state to allow access to the glove box.

In order to release the steering wheel from the locked state, the manual switch 210-ST is depressed. The timer 222-ST becomes active to output the timer signal St for the given period of time. During the period of time in which the timer 222-ST is active, the antenna 214-ST is connected to the microprocessor 232 via the demodulator 230 to receive the code signal SC from the transmitter 100. When the input code matches the preset code in the memory 236, the driver signal generator 204-ST outputs the driver signal to reverse the position of the steering lock device 220-ST from the locked state to the unlocked state.

On the other hand, when the battery voltage drops below the predetermined voltage and the battery checker 300 detects that the battery is weak, the alarm-code-indicative signal is transmitted to the controller when any of the manual switches are depressed. As a result, the user is notified that the transmitter battery has become weak and needs to be replaced with a fresh one. This satisfactorily prevents the transmitter form becoming inoperative due to lack of power.

As will be appreciated herefrom, according to the present invention, the user is now free of the responsibility of memorizing the preset code and need only depress a manual switch corresponding to the desired lock device to be operated. In addition, since the keyless entry system includes a weak-battery alarm, the user can replace the battery of transmitter before the battery voltage drops below the predetermined voltage.

Therefore, the present invention fulfills all of the objects and advantages sought therefor.

What is claimed is:

1. A keyless entry system for an automotive vehicle lock device for selectably actuating the lock device to either of a first locked position and a second unlocked position, comprising:
   an electrical actuator associated with said lock device and responsive to a control signal to reverse the position of said lock device;
   a manual switch mounted on a vehicle body and manually operable;
   a transmitter responsive to a first radio signal which is produced in response to operation of said manual switch to output a second radio signal indicative of a predetermined digit of a unique code which identifies the transmitter;

a battery mounted on said transmitter for supplying electric power to said transmitter;

a controller mounted on said vehicle body and electrically connected to said manual switch to detect manual operation of said manual switch for transmitting said first radio signal in response to operation of said manual switch for activating said transmitter, receiving said second radio signal from said transmitter, comparing the unique code indicated by said second radio signal with a preset code, and in response to said manual switch, producing said control signal when said unique code matches said preset code; and a weak-battery alarm means for detecting when the voltage generated by said battery drops below a given voltage and producing an alarm in such cases, said weak-battery alarm means comprising a first means incorporated in said transmitter for monitoring supply voltage of said battery to produce a predetermined digit of a weak-battery indicative code to be contained in said second radio signal, and a second means incorporated in said controller and responsive to said weak-battery indicative code for producing said alarm.

2. The keyless entry system as set forth in claim 1, wherein said transmitter and said controller each include an antenna and wherein electromagnetic induction between said antennae allows transmission of said radio signal.

3. The keyless entry system as set forth in claim 1, wherein said transmitter is small enough to fit in a clothing pocket.

4. The keyless entry system as set forth in claim 1, wherein said lock device is one of a door lock, a trunk lid lock, a glove box lid lock and a steering lock device.

5. The keyless entry system as set forth in claim 1, wherein said vehicle device including a plurality of devices to be operated independently of each other, said actuator comprising a pluratity of actuators respectively adaped to operate corresponding one of said devices, and manual switch including a plurality of switch elements respectively adapted to operate corresponding one of said actuator to operate corresponding devices.

6. The keyless entry system as set forth in claim 5, wherein said controller further comprises means, associated with said switch elements, for identifying one of the devices corresponding to one of the switch elements operated.

7. The keyless entry system as set forth in claim 6, wherein each of manual switch is provided on the vehicle body adjacent the corresponding device to operate.

8. The keyless entry system as set forth in claim 7, wherein said lock device comprises a door lock, a trunk lid lock, a glove box lid lock and a steering lock device, and said manual switch including a plurality of switch elements each of which corresponds to one of said lock devices.

9. The keyless entry system as set forth in claim 1, wherein said transmitter and said controller each include an antenna and wherein electromagnetic induction between said antennae allows transmission of radio signals.

10. The keyless entry system as set forth in claim 10, wherein said transmitter is small enough to fit in a clothing pocket.

11. The keyless entry system as set forth in claim 10, wherein said lock device is one of a door lock device, a trunk lid lock device, a glove box lid lock device and a steering lock device.

12. The keyless entry system as set forth in claim 11, wherein said lock device comprises a door lock device, a trunk lid lock device, a glove box lid lock device and a steering lock device, and said manual switch includes a plurality of switch elements, each of which corresponds to one of said lock devices.

13. The keyless entry system as set forth in claim 1, wherein said transmitter includes a memory storing an operation code to be used for operating said actuator and an alarm code to be used for operating said alarm means, and said controller includes a memory storing an operation code and an alarm code respectively corresponding to said operation and alarm codes of the transmitter.

14. A keyless entry system for an automotive vehicle for operating one of a plurality of vehicle devices including a door lock device which is selectively operable to either of a first locked position and a second unlocked position, comprising:

a plurality of electrical actuators respectively associated with the corresponding vehicle devices and responsive to a control signal to operate said corresponding vehicle device to desired position;

a plurality of manual switches mounted on the vehicle and manually operable, each switch adapted for enabling operating one of the corresponding electrical actuators;

a transmitter responsive to a first radio signal which is produced in response to operation of one of said manual switches for outputting a second radio signal indicative of a unique code which identifies the transmitter;

a battery mounted on said transmitter for supplying electric power to said transmitter;

a controller mounted on said vehicle body and electrically connected to each of said manual switches so as to be triggered by manual operation of said manual switches for transmitting said first radio signal in response to operation of said manual switch for activating said transmitter, receiving said second radio signal from said transmitter, comparing the unique code indicated by said second radio signal with a preset code, and in response to one of said manual switches, producing said control signal when said unique code matches said preset code, said controller including means responsive to manual operation of said one of said manual switches for identifying one of said actuators to be operated and operating said identified actuator for operating one of the vehicle devices corresponding to the manual switch operated; and a weak-battery alarm means for detecting when the voltage generated by said battery drops below a given voltage and producing an alarm in such cases, said weak-battery alarm means comprising a first means incorporated in said transmitter for monitoring supply voltage of said battery to produce a weak-battery indicative code to be contained in said second radio signal, and a second means incorporated in said controller and responsive to said weak-battery indicative code for producing said alarm.

15. The keyless entry system as set forth in claim 14, wherein said transmitter is portable and said controller is mounted on a vehicle and associated with said manual switches, and said controller being responsive to operation of one of said manual switches to produce a radio signal which activates said transmitter to output said unique code-indicative radio signal.

16. The keyless entry system as set forth in claim 15, wherein said controller further comprises means, associated with said switch elements, for identifying one of the devices corresponding to one of the switch elements operated.

17. The keyless entry system as set forth in claim 16, wherein each of said manual switches is provided on the vehicle body adjacent the corresponding device to operate same.

18. A keyless entry system for an automotive vehicle lock device for selectably actuating the lock device to either of a first locked position and a second unlocked position, comprising:
- an electrical actuator associated with said lock device and responsive to a control signal to reverse the position of said lock device;
- a manual switch mounted on a vehicle body and manually operable for initiating keyless entry operation;
- a transmitter including a detector and a radio signal transmitter circuit, said detector being normally in a stand-by state in which said transmitter is detective of a first radio signal which is produced in response to manual operation of said manual switch, said transmitter being responsive to detection of said first radio signal by said detector for activating said radio signal transmitter circuit for outputting a second radio signal indicative of a unique code which identifies the transmitter;
- a battery mounted on said transmitter for supplying electric power to said transmitter;
- a weak-battery checker incorporated in said transmitter and cooperative with said radio signal transmitter circuit for checking battery voltage upon transmission of said second radio signal, said battery checker being responsive to the battery voltage lower than a given value to modify said second radio signal to be transmitted so that said modified second radio signal indicates a weak battery alarming command; and
- a controller mounted on said vehicle body and electrically connected to said manual switch to detect manual operation of said manual switch for transmitting said first radio signal in response to operation of said manual switch for activating said transmitter, comparing the unique code indicated by said second radio signal with a preset code, and, in response to said manual switch, producing said control signal when said unique code matches said preset code, said controller being responsive to said modified second radio signal indicative of said weak battery alarming command to output an alarm signal; and
- an alarm electrically connected to said controller and responsive to said alarm signal to generate an alarm.

* * * * *